(12) United States Patent
Sasaki (10) Patent No.: US 7,172,958 B2
(45) Date of Patent: Feb. 6, 2007

(54) HIGH-FREQUENCY WIRING STRUCTURE AND METHOD FOR PRODUCING THE SAME

(75) Inventor: Yorihiko Sasaki, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 199 days.

(21) Appl. No.: 11/050,112

(22) Filed: Feb. 2, 2005

(65) Prior Publication Data

US 2005/0179129 A1 Aug. 18, 2005

(30) Foreign Application Priority Data

Feb. 16, 2004 (JP) .............................. 2004-038282

(51) Int. Cl.
*H01L 21/44* (2006.01)
*H01L 21/50* (2006.01)
*H01L 21/469* (2006.01)

(52) U.S. Cl. ............... 438/617; 257/728; 257/E21.508; 257/E31.117; 257/E23.053; 257/E23.01; 257/E21.518

(58) Field of Classification Search ................ 438/617; 257/728
See application file for complete search history.

(56) References Cited

U.S. PATENT DOCUMENTS 5,768,109 A * 6/1998 Gulick et al. ............... 361/794
6,033,982 A * 3/2000 Lopatin et al. ............. 438/635
6,057,600 A 5/2000 Kitazawa et al.
6,483,406 B1 * 11/2002 Sawa et al. .................. 333/247
6,696,347 B1 * 2/2004 Hikita et al. ................. 438/406
6,712,284 B2 * 3/2004 Aoki et al. .................. 257/183
6,714,422 B2 * 3/2004 Okubora et al. ............ 361/793
6,960,924 B2 * 11/2005 Akram ........................ 324/754

FOREIGN PATENT DOCUMENTS

| JP | 9-172107 | 6/1997 |
|---|---|---|
| JP | 10-242599 | 9/1998 |

\* cited by examiner

*Primary Examiner*—Walter Lindsay, Jr.
*Assistant Examiner*—Thu-Huong Dinh
(74) *Attorney, Agent, or Firm*—Beyer, Weaver & Thomas, LLP.

(57) ABSTRACT

A high-frequency wiring structure includes a microstrip line having a ground conductor, a dielectric disposed on the ground conductor, and a transmission conductor that is at least partially disposed in the dielectric. The transmission conductor is defined by a flat bottom parallel to the ground conductor, a pair of flat sides that are perpendicular to the ground conductor and are positioned on both sides of the flat bottom in the wiring width direction, and curved parts that continuously join the flat bottom and the pair of flat sides. The curved parts have a radius of curvature within the range of 5% to 50% of the thickness of the transmission conductor.

6 Claims, 5 Drawing Sheets

HIGH-FREQUENCY WIRING STRUCTURE AND METHOD FOR PRODUCING THE SAME

BACKGROUND OF THE INVENTION

1. Field of the Invention

The present invention relates to high-frequency wiring structures and methods for producing the high-frequency wiring structures and, particularly, to a high-frequency wiring structure capable of reducing loss and a method for producing the high-frequency wiring structure.

2. Description of the Related Art

Increasing application of high frequencies, including microwaves and millimeter waves, for consumer products has recently been expanding the field of radio communications, such as mobile radio communications, satellite communications, and vehicle collision avoidance systems. Accordingly, higher frequencies are used for data communications, and signals with higher frequencies are processed in transmitters and receivers.

General transmitters and receivers include a printed circuit board or ceramic board, a dielectric layer formed thereon, and a fine circuit pattern (wiring pattern) formed thereon. ICs and passive components, for example, are mounted in the circuit pattern. The dielectric layer is formed by a vacuum process such as sputtering while the circuit pattern is formed by patterning using photolithography.

Japanese Unexamined Patent Application Publication Nos. 10-242599 (Patent Document 1) and 9-172107 (Patent Document 2) disclose examples of circuit patterns in transmitters and receivers that operate at high frequencies. Patent Document 1 discloses a wiring board including a transmission conductor having a bottom surface parallel to a ground layer and continuously curved side surfaces. Patent Document 2 discloses a wiring board including a transmission conductor that at least has a continuously curved surface in contact with a dielectric. Loss can be reduced according to Patent Documents 1 and 2. The dielectric used for either circuit board is photosensitive benzocyclobutene (BCB). These circuit boards are produced by forming a groove with a predetermined shape on the photosensitive BCB using photolithography and embedding a transmission conductor in the groove as signal wiring. The sectional shapes of the above transmission conductors are formed through the use of a phenomenon in which the exposure and development of photosensitive BCB allows the formation of a groove with a specific sectional shape.

For the circuit board disclosed in Patent Document 1, however, the region through which high-frequency current passes is limited to the curved parts of the transmission conductor. As a result, the cross-sectional area of the transmission conductor is small relative to the designed line width; this circuit board undesirably exhibits higher loss. On the other hand, the transmission conductor of the circuit board disclosed in Patent Document 2 has a curved surface adjacent to the dielectric and a flat top surface parallel to the ground layer, thus having sharp edges between the curved surface and the flat surface. As a result, unfortunately, high-frequency current readily concentrates on the sharp edges, leading to higher loss.

SUMMARY OF THE INVENTION

An object of the present invention is to solve the above problems and provide a high-frequency wiring structure that can prevent loss of high-frequency current due to partial concentration and reduce loss of high-frequency current with a transmission conductor having a larger cross-sectional area, and a method for producing the high-frequency wiring structure.

To achieve the above object, the present invention provides a high-frequency wiring structure including a microstrip line having a ground conductor, a dielectric disposed on the ground conductor, and a transmission conductor that is at least partially disposed in the dielectric. The transmission conductor is defined by a flat bottom parallel to the ground conductor, a pair of flat sides that are perpendicular to the ground conductor and are positioned on both sides of the flat bottom in the wiring width direction, and curved parts that continuously join the flat bottom and the pair of flat sides. The curved parts have a radius of curvature within the range of 5% to 50% of the thickness of the transmission conductor.

According to the above structure, the curved parts, having a radius of curvature within the above range, can relieve the concentration of high-frequency current to reduce high-frequency loss. Moreover, the transmission conductor, having the flat sides in addition to the flat bottom, can attain a larger cross-sectional area than a transmission conductor in conventional circuit wiring to reduce the high-frequency loss. Furthermore, the curved parts and the flat sides are continuously joined to relieve the concentration of high-frequency current, thus reducing the loss.

In the above high-frequency wiring structure according to the present invention, the curved parts preferably have a radius of curvature within the range of 10% to 40% of the thickness of the transmission conductor. Such a structure can further relieve the concentration of high-frequency current, thus attaining a smaller loss.

The present invention further provides a method for producing a high-frequency wiring structure including a microstrip line having a ground conductor, a dielectric disposed on the ground conductor, and a transmission conductor that is at least partially disposed in the dielectric. This method includes the steps of forming a conductive seed layer on a substrate and then forming a mask resist layer in which a conductor pattern portion is opened on the conductive seed layer, forming a first patterned conductor in the conductor pattern portion by plating and then etching the mask resist layer so that the top surface thereof is flush with the top surface of the first patterned conductor, forming a second patterned conductor having a thickness within the range of 5% to 50% of the thickness of the first patterned conductor on the first patterned conductor by plating, removing the mask resist layer and then etching the second patterned conductor to process both sides of the second patterned conductor in the width direction into curved surfaces, allowing the first and second patterned conductors on the substrate to face the dielectric and then pressing and embedding the first and second patterned conductors into the dielectric, and removing the substrate and the conductive seed layer to form the transmission conductor, which includes the first and second patterned conductors.

The present invention provides another method for producing a high-frequency wiring structure including a microstrip line having a ground conductor, a dielectric disposed on the ground conductor, and a transmission conductor that is at least partially disposed in the dielectric. This method includes the steps of forming a conductive seed layer on a substrate and then forming a mask resist layer in which a conductor pattern portion is opened on the conductive seed layer, forming a first patterned conductor having a thickness within the range of 20% to 90% of the thickness of the mask resist layer in the conductor pattern portion by plating, forming a second patterned conductor having a thickness within the range of 5% to 50% of the thickness of the first patterned conductor on the first patterned conductor and the mask resist layer by sputtering, removing the mask resist layer and the part of the second patterned conductor that is formed thereon by a lift-off process, allowing the first and second patterned conductors on the substrate to face the dielectric and then pressing and embedding the first and second patterned conductors into the dielectric, and removing the substrate and the conductive seed layer to form the transmission conductor, which includes the first and second patterned conductors.

The above methods for producing the high-frequency wiring structure enable the formation of a transmission conductor having a flat bottom, flat sides, and curved parts; that is, the first patterned conductor constitutes the flat sides while the second patterned conductor constitutes the flat bottom and the curved parts. In addition, the radius of curvature of the curved parts can be controlled by adjusting the thickness of the second patterned conductor.

In the methods for producing the high-frequency wiring structure according to the present invention, the second patterned conductor preferably has a thickness within the range of 10% to 40% of the thickness of the first patterned conductor. According to such a structure, the radius of curvature of the curved parts can be controlled within a narrower range.

The high-frequency wiring structure according to the present invention can prevent loss of high-frequency current due to partial concentration and reduce loss of high-frequency current with a transmission conductor having a larger cross-sectional area.

DESCRIPTION OF THE PREFERRED EMBODIMENTS

[First Embodiment]

Figure 1:
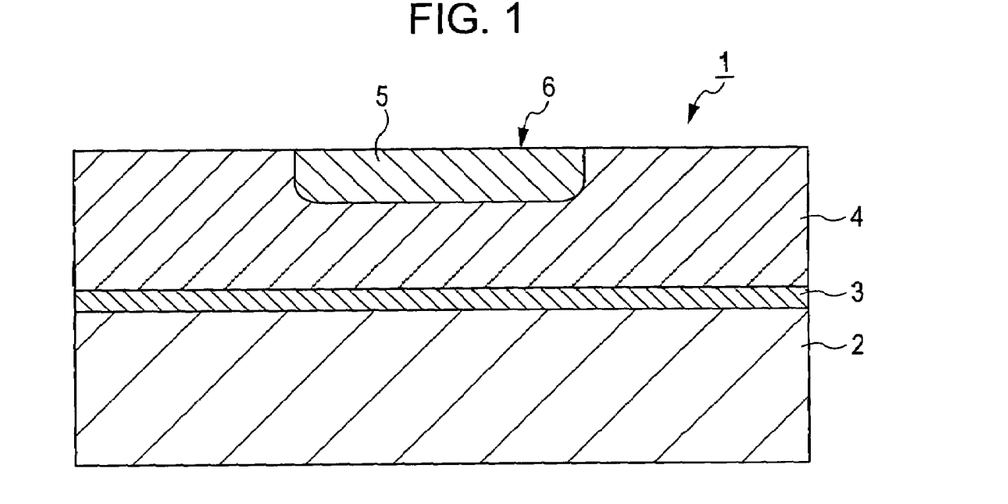
FIG. 1 is a schematic sectional view of a high-frequency wiring structure according to a first embodiment of the present invention.
Figure 2:
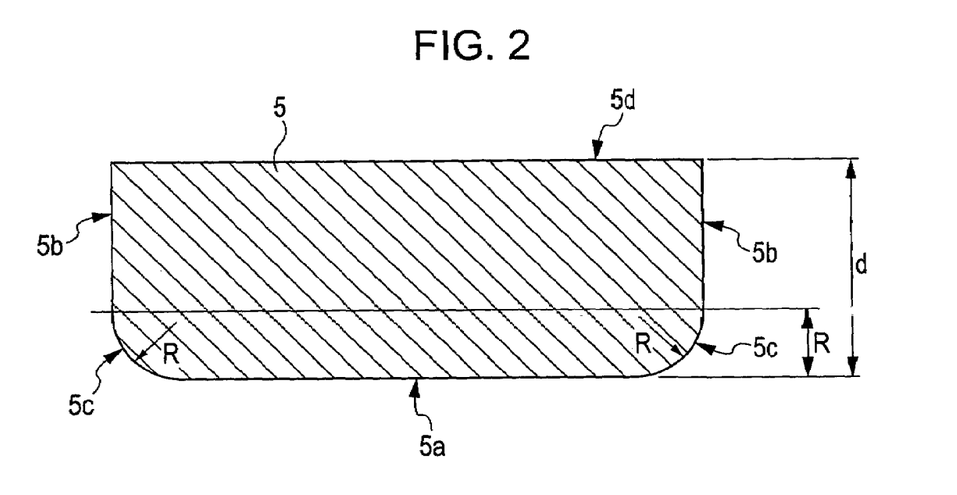
FIG. 2 is an enlarged schematic sectional view of the main part of the high-frequency wiring structure according to the first embodiment of the present invention.

A first embodiment of the present invention will now be described with reference to the drawings. FIG. 1 is a schematic sectional view of a high-frequency wiring structure according to this embodiment. FIG. 2 is a schematic sectional view of the main part of the high-frequency wiring structure. Referring to FIG. 1, a high-frequency wiring structure 1 according to this embodiment includes a microstrip line 6 having an insulating substrate 2, a ground conductor 3 formed on the insulating substrate 2, a dielectric 4 disposed on the ground conductor 3, and a transmission conductor 5 that is at least partially disposed in the dielectric 4.

The insulating substrate 2 used may be any substrate that can support the ground conductor 3 and the dielectric 4, for example a glass epoxy substrate or an alumina substrate. The insulating substrate 2, which is not an essential component, may be omitted if the dielectric 4 has relatively high strength.

The ground conductor 3 is made of, for example, a material with excellent conductivity, such as Cu and Ag, and has a thickness of about 5 to 20 μm. This ground conductor 3 may be formed on the insulating substrate 2 or the dielectric 4 by a normal film deposition process, such as sputtering and vapor deposition, or by attaching a metal foil.

The dielectric 4 is preferably made of, for example, polyester resin or epoxy resin.

In FIGS. 1 and 2, substantially the overall transmission conductor 5 is embedded in the dielectric 4 and is formed in a line extending from the front to back of FIG. 1. This transmission conductor 5 is made of, for example, a conductive material such as Cu and Ag. The transmission conductor 5, which is substantially rectangular in cross-section, is defined by a flat bottom 5a parallel to the ground conductor 3, a pair of flat sides 5b that are perpendicular to the ground conductor 3 and are positioned on both sides of the flat bottom 5a in the wiring width direction, curved parts 5c that continuously join the flat bottom 5a and the pair of flat sides 5b, and a flat top 5d that is nearly parallel to the flat bottom 5a. Of the edges of the four corners of the transmission conductor 5, the curved parts 5c are provided at the edges near the ground conductor 3.

Because the transmission conductor 5 has the flat sides 5b in addition to the flat bottom 5a, the side surfaces of the transmission conductor 5 are composed of the curved parts 5c and the flat sides 5b. That is, the side surfaces of the transmission conductor 5 are partially flat (the flat sides 5b). As a result, the thickness of the transmission conductor 5 is increased by the length of the flat sides 5b. Accordingly, the transmission conductor 5 has a larger cross-sectional area than a transmission conductor in conventional circuit wiring to enable the reduction of high-frequency loss. In addition, the curved parts 5c and the flat sides 5b are continuously joined to relieve the concentration of high-frequency current, thus reducing the loss.

Referring to FIG. 2, the curved parts 5c of the transmission conductor 5 have a radius of curvature R within the range of 5% to 50% of the thickness d of the transmission conductor 5. A radius of curvature R less than 5% is undesirable because the curved parts 5c become small and sharp. In this case, high-frequency current concentrates on the curved parts 5c to cause a larger loss. Also, a radius of curvature R more than 50% is undesirable because the relative area of the flat sides 5b becomes small. In this case, the region through which high-frequency current passes is limited to the vicinity of the curved parts 5c to cause a larger loss. The loss can be reduced more effectively by controlling the radius of curvature R within the range of 10% to 40% of the thickness d.

Specifically, the transmission conductor 5 preferably has a thickness d within the range of, for example, 5 to 20 μm, and the curved parts 5c preferably have a radius of curvature R within the range of, for example, 0.5 to 8 μm.

The width of the transmission conductor 5 is almost exclusively determined by the relationship with operating frequency. For example, the transmission conductor 5 preferably has a width of about 50 μm for operation at 5 GHz. In the present invention, the flat bottom 5a is required in association with the width of the transmission conductor 5. If the flat bottom 5a is omitted and the pair of curved parts 5c are joined to each other, the absolute value of the radius of curvature R must be increased in terms of the matching with the operating frequency. For example, the radius of curvature R must exceed 50 μm for an operating frequency of 5 GHz. Consequently, the transmission conductor 5 has an excessively large cross-sectional area. In the present invention, the flat bottom 5a provides the advantage that it ensures the necessary conductor width to eliminate the need for excessively increasing the radius of curvature R of the curved parts 5c; therefore, the radius of curvature R may be adjusted to the minimum size required for preventing the concentration of an electric field.

The flat bottom 5a is preferably parallel to the ground conductor 3. A flat bottom 5a inclined with respect to the ground conductor 3 is undesirable because varying distances between the transmission conductor 5 and the ground conductor 3 compromise the transmission of high-frequency current.

Preferably, the flat sides 5b are perpendicular to the ground conductor 3 and are parallel to each other. Inclined flat sides 5b are undesirable. If the flat sides 5b are inclined in the directions in which they move away from each other toward the flat top 5d, the area of the transmission conductor 5 that is opposed to the ground conductor 3 is increased. As a result, the thickness d of the transmission conductor 5 is decreased, and therefore its cross-sectional area is decreased, thus causing a larger loss. If, on the other hand, the flat sides 5b are inclined in the directions in which they approach each other toward the flat top 5d, the flat sides 5b and the flat bottom 5a intersect at an acute angle. As a result, an electric field concentrates on the curved parts 5c, thus causing a larger loss.

As described above, the high-frequency wiring structure according to the present invention can prevent loss of high-frequency current due to partial concentration and reduce loss of high-frequency current with a transmission conductor having a larger cross-sectional area.

[Second Embodiment]

A method for producing a high-frequency wiring structure according to a second embodiment of the present invention will now be described. FIGS. 3A to 3G and 4A to 4D illustrate the steps of the method for producing a high-frequency wiring structure according to this embodiment. The method for producing a high-frequency wiring structure according to this embodiment mainly includes the steps of forming a mask resist layer on a substrate, forming first patterned conductors, forming second patterned conductors, processing the second patterned conductors to form curved surfaces, embedding the first and second patterned conductors into a dielectric, and removing the substrate.

Figure 3A:
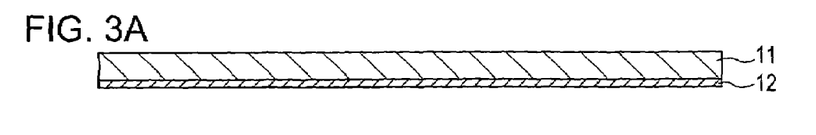
FIGS. 3A to 3G illustrate the steps of a method for producing a high-frequency wiring structure according to a second embodiment of the present invention.
Figure 3B:
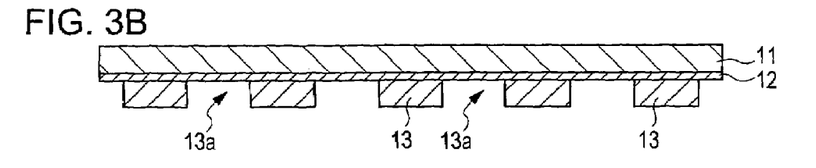

In the step of forming the mask resist layer on the substrate, a conductive seed layer is formed on the substrate, and the mask resist layer is formed on the conductive seed layer. Conductor pattern portions are opened in the mask resist layer. Referring to FIG. 3A, a conductive seed layer 12 is deposited on a substrate 11. The substrate 11 used may be a glass substrate having a thickness of about 700 μm. The substrate 11 preferably has extremely high smoothness, namely a surface roughness of 0.1 to 0.3 μm or less. The conductive seed layer 12 used may be, for example, a sputtered copper film having a thickness of about 0.1 μm. Referring to FIG. 3B, a mask resist layer 13 having a thickness of about 5 μm is deposited on the conductive seed layer 12. Preferably, predetermined conductor pattern portions 13a are opened in the mask resist layer 13. The conductor pattern portions 13a preferably have a width of, for example, about 50 μm, though it depends on the operating frequency of wiring. The conductive seed layer 12 is preferably bare in the conductor pattern portions 13a.

Figure 3C:
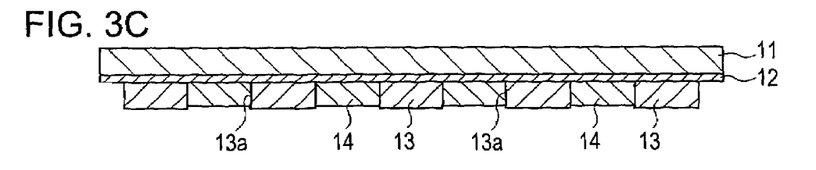
Figure 3D:
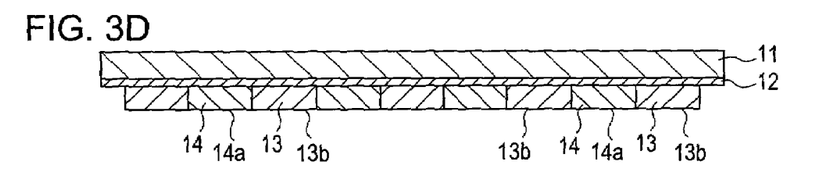

In the step of forming the first patterned conductors, the first patterned conductors are formed in the conductor pattern portions 13a by plating, and the mask resist layer 13 is etched so that its top surface is flush with the top surfaces of the first patterned conductors.

Referring to FIG. 3C, first patterned conductors 14 made of, for example, copper are formed in the conductor pattern portions 13a by electroplating using the conductive seed layer 12 as an electrode. Specifically, the plating is performed by bringing the surface of the conductive seed layer 12 that is not covered with the mask resist layer 13 into contact with a plating bath. The plating bath used is, for example, a copper sulfate solution. The thickness of the resultant first patterned conductors 14 is preferably about 40% of that of the mask resist layer 13. If, for example, the mask resist layer 13 has a thickness of 5 μm, the first patterned conductors 14 preferably have a thickness of about 2 μm.

Referring to FIG. 3D, the mask resist layer 13 is etched so that its top surface 13b is flush with the top surfaces 14a of the first patterned conductors 14. The etching is preferably performed by dry etching such as sputtering.

Figure 3E:
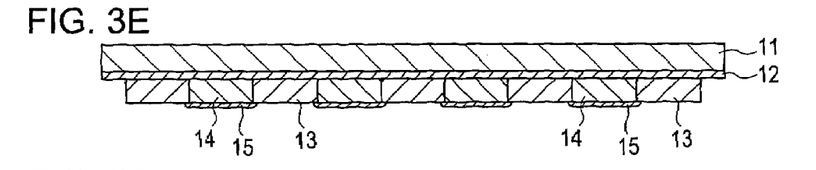

In the step of forming the second patterned conductors, the second patterned conductors are formed on the first patterned conductors 14 by plating. The second patterned conductors have a thickness within the range of 5% to 50% of that of the first patterned conductors 14.

Referring to FIG. 3E, second patterned conductors 15 made of, for example, copper are formed on the first patterned conductors 14 by electroplating using the conductive seed layer 12 and the first patterned conductors 14 as an electrode. Specifically, the plating is performed by bringing the first patterned conductors 14 into contact with a plating bath such as a copper sulfate solution. The thickness of the resultant second patterned conductors 15 is preferably about 5% to 50%, more preferably about 10% to 40%, of that of the first patterned conductors 14. If, for example, the first patterned conductors 14 have a thickness of 2 μm, the second patterned conductors 15 preferably have a thickness of about 0.1 to 1 μm. The second patterned conductors 15 constitute the flat bottoms and curved parts of the resultant transmission conductors. The radius of curvature R of the curved parts can be adjusted by controlling the thickness of the second patterned conductors 15.

As shown in FIG. 3E, the second patterned conductors 15 grow by plating not only in the thickness direction, but also in the width direction. The growth in the width direction is substantially negligible because the rate of growth in the width direction is about one-third of that in the thickness direction.

Figure 3F:
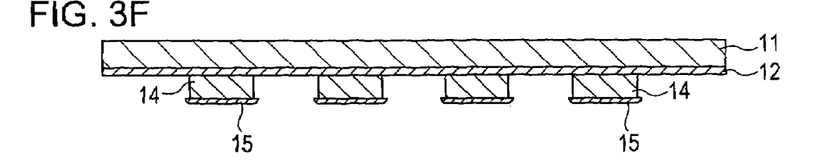

In the step of processing the second patterned conductors 15 to form curved surfaces, first, the mask resist layer 13 is removed to leave the first patterned conductors 14 deposited on the substrate 11 and the second patterned conductors 15 deposited on the first patterned conductors 14, as shown in FIG. 3F. The second patterned conductors 15 have a larger width than the first patterned conductors 14.

Figure 3G:
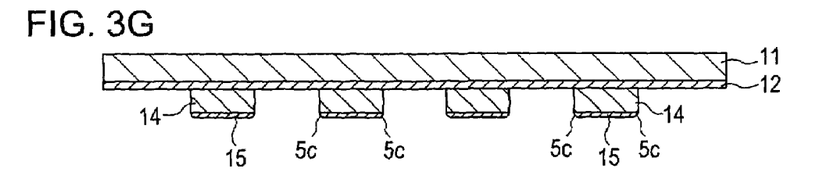

Referring to FIG. 3G, both sides of the second patterned conductors 15 in the width direction were processed into curved surfaces by wet etching with an etchant such as a 10% ferric chloride solution. Both sides of the second patterned conductors 15 in the width direction have protrusions protruding in the width direction; these protrusions are preferentially etched to form the curved parts 5c.

Figure 4A:
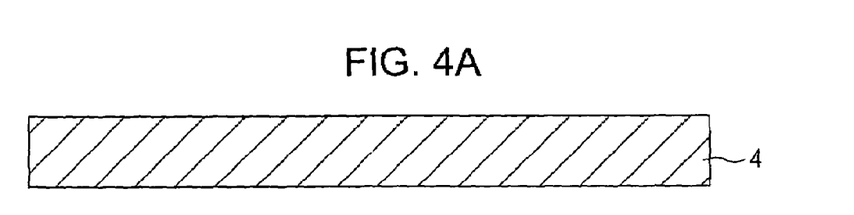
FIGS. 4A to 4D illustrate the steps of the method for producing a high-frequency wiring structure according to the second embodiment of the present invention.
Figure 4B:
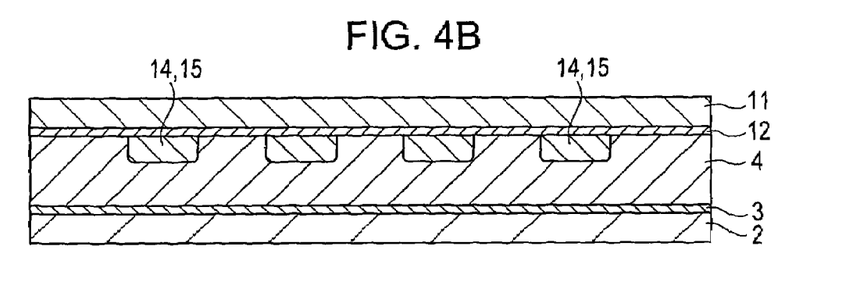

In the step of embedding the first and second patterned conductors 14 and 15 into the dielectric, the first and second patterned conductors 14 and 15 disposed on the substrate 11 are allowed to face the dielectric 4, and are pressed and embedded into the dielectric 4.

Referring to FIG. 4A, a dielectric substrate 4 is prepared which is made of, for example, epoxy resin and has a thickness of 15 μm. The substrate 11 on which the first and second patterned conductors 14 and 15 are formed is disposed on the top of the dielectric substrate 4 while the insulating substrate 2, on which the ground conductor 3 is deposited, is disposed on the bottom of the dielectric substrate 4.

Referring to FIG. 4B, the substrate 11 and the insulating substrate 2 are pressed against the dielectric substrate 4 while the dielectric substrate 4 is heated. As a result of the heat pressing, the first and second patterned conductors 14 and 15 are embedded into the dielectric substrate 4, and the ground conductor 3 is bonded to the dielectric substrate 4. The heat pressing temperature preferably ranges from 140° C. to 180° C., though depending on the material used for the dielectric substrate 4. The pressure in the heat pressing is preferably about 15 to 25 Pa, and the pressing time is preferably about 30 to 50 minutes. After the heat pressing, the first and second patterned conductors 14 and 15 are embedded into the dielectric substrate 4.

Figure 4C:
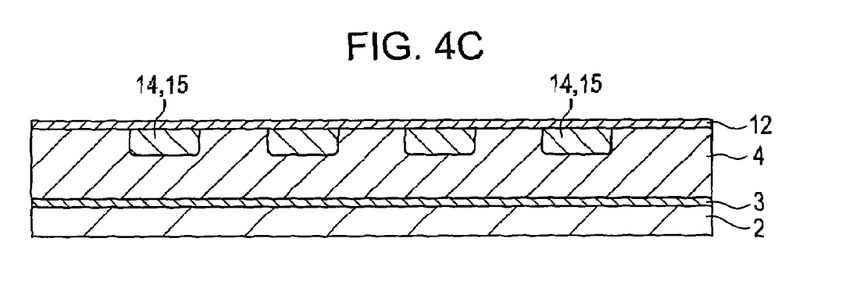
Figure 4D:
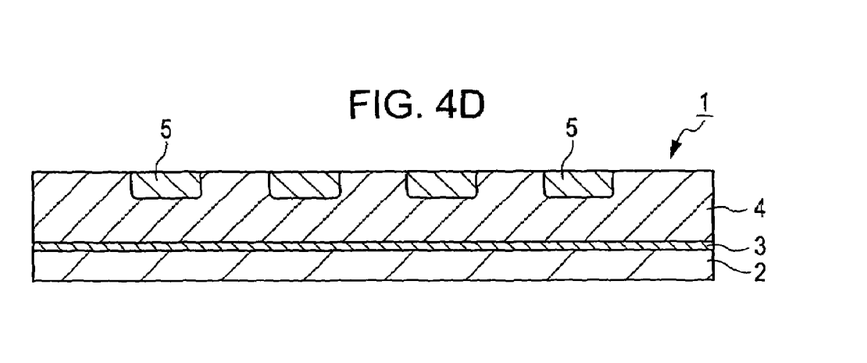

In the step of removing the substrate 11, the substrate 11 and the conductive seed layer 12 are removed to form the transmission conductors 5, which are composed of the first and second patterned conductors 14 and 15.

Referring to FIG. 4C, the substrate 11 is slowly peeled off the conductive seed layer 12. Referring to FIG. 4D, subsequently, the conductive seed layer 12 is removed by wet etching with an etchant such as a 10% ferric chloride solution, thus providing the high-frequency wiring structure 1. The high-frequency wiring structure 1 includes the transmission conductors 5, which are composed of the first and second patterned conductors 14 and 15 embedded in the dielectric substrate 4.

The above method for producing a high-frequency wiring structure enables easy formation of the transmission conductor 5 having the flat bottom 5a, the flat sides 5b, and the curved parts 5c; that is, the flat sides 5b can be provided by the first patterned conductors 14 while the flat bottom 5a and the curved parts 5c can be provided by the second patterned conductors 15. In addition, the radius of curvature R of the curved parts 5c can be controlled by adjusting the thickness of the second patterned conductors 15.

[Third Embodiment]

A method for producing a high-frequency wiring structure according to a third embodiment of the present invention will now be described. FIGS. 5A to 5E illustrate the steps of the method for producing a high-frequency wiring structure according to this embodiment. The method for producing a high-frequency wiring structure according to this embodiment mainly includes the steps of forming a mask resist layer on a substrate, forming first patterned conductors, forming second patterned conductors, removing the mask resist layer together with parts of the second patterned conductors by a lift-off process, embedding the first and second patterned conductors into a dielectric, and removing the substrate.

Some steps of the method for producing a high-frequency wiring structure according to this embodiment are the same as in the method according to the second embodiment described above: the step of forming the mask resist layer, the step of embedding the first and second patterned conductors into the dielectric, and the step of removing the substrate. These steps are therefore briefly described in the following description.

Figure 5A:
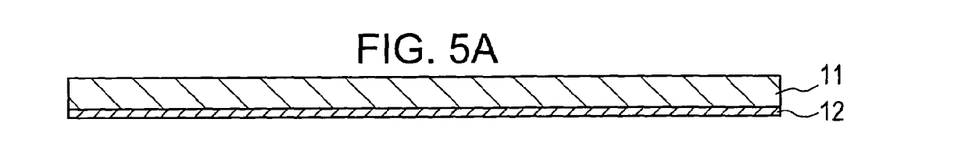
FIGS. 5A to 5E illustrate the steps of a method for producing a high-frequency wiring structure according to a third embodiment of the present invention.
Figure 5B:
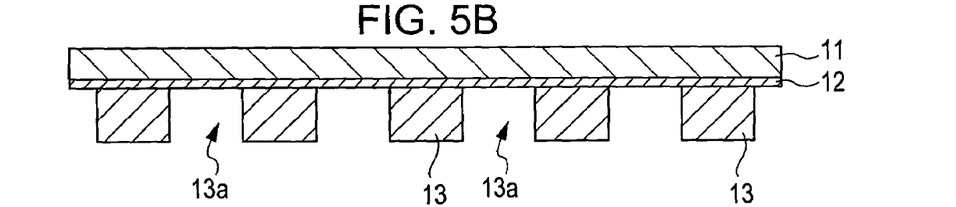

Referring to FIGS. 5A and 5B, the conductive seed layer 12 is formed on the substrate 11, and the mask resist layer 13 is formed on the conductive seed layer 12. The steps so far are the same as in the second embodiment. In this embodiment, the mask resist layer 13 preferably has a larger thickness than that in the second embodiment, for example a thickness within the range of 5 to 20 μm.

Figure 5C:
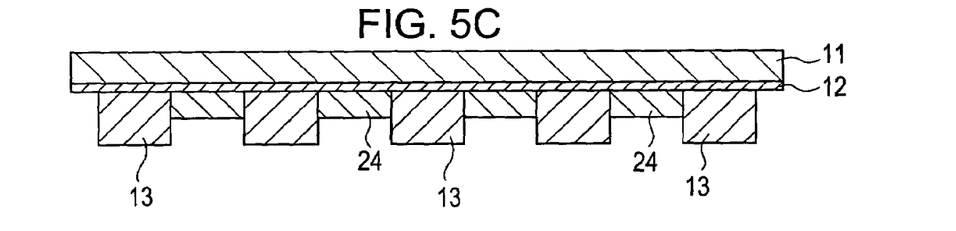

In the step of forming the first patterned conductors, the first patterned conductors are formed in the conductor pattern portions 13a by plating. The first patterned conductors have a thickness within the range of 20% to 90% of that of the mask resist layer 13. Referring to FIG. 5C, first patterned conductors 24 made of, for example, copper are formed in the conductor pattern portions 13a by electroplating using the conductive seed layer 12 as an electrode. The resultant first patterned conductors 24 preferably have a thickness within the range of about 20% to 90% of that of the mask resist layer 13.

Figure 5D:
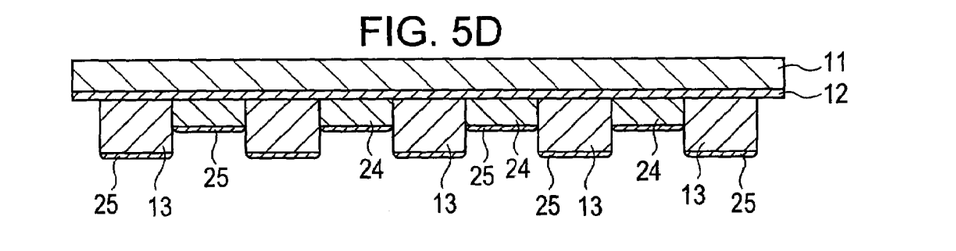

In the step of forming the second patterned conductors, as shown in FIG. 5D, second patterned conductors 25 are deposited on the first patterned conductors 24 and the mask resist layer 13 by sputtering. In this step, copper films, for example, are sputtered onto the first patterned conductors 24 and the mask resist layer 13 without using a mask or the like to deposit the second patterned conductors 25. Referring to FIG. 5D, the sputtered films, namely the second patterned conductors 25, have a sectional shape with a thickness that is gradually decreased at both ends in the width direction. The ends of the second patterned conductors 15 in the width direction have a nearly curved shape resulting from the difference in thickness between the first patterned conductors 24 and the mask resist layer 13. The thickness of the sputtered films is decreased in the vicinity of stepped boundaries between the first patterned conductors 24 and the mask resist layer 13 because sputtered particles are diffused there.

The second patterned conductors 25 preferably have a thickness within the range of about 5% to 50% of that of the first patterned conductors 24. If, for example, the first patterned conductors 24 have a thickness of 2 μm, the second patterned conductors 25 preferably have a thickness of about 0.1 to 1 μm. The second patterned conductors 25 constitute the flat bottoms and curved parts of the resultant transmission conductors. The radius of curvature R of the curved parts can be adjusted by controlling the thickness of the second patterned conductors 15.

Figure 5E:
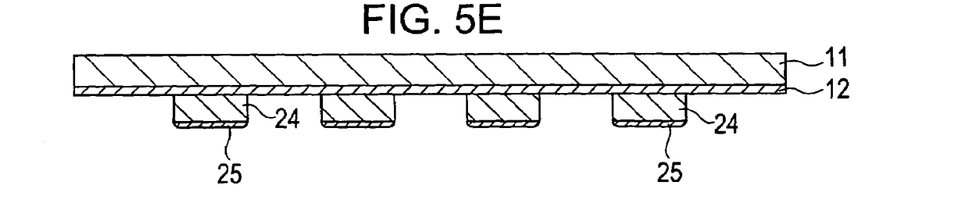

In the step of removing the mask resist layer 13, as shown in FIG. 5E, the mask resist layer 13 and the second patterned conductors 25 deposited on the mask resist layer 13 are removed by a lift-off process.

Subsequently, as in the second embodiment described with reference to FIGS. 4A to 4D, the first and second patterned conductors 24 and 25 disposed on the substrate 11 are allowed to face the dielectric 4, and are pressed and embedded into the dielectric 4. The substrate 11 and the conductive seed layer 12 are sequentially removed, thus providing the high-frequency wiring structure 1 as shown in FIGS. 1 and 2.

EXAMPLES

The present invention will now be described in more detail with examples.

Sputtered copper films having a thickness of 0.1 μm were deposited on glass substrates having a thickness of 700 μm to form conductive seed layers. Mask resist layers having a thickness of 5 μm were formed on the conductive seed layers. Conductor pattern portions having a width of 50 μm were provided in the mask resist layers. First patterned conductors made of copper films having a thickness of 2 μm were formed in the conductor pattern portions by plating with copper using the conductive seed layers as electrodes. The mask resist layers were etched so that they had the same thickness as the first patterned conductors.

Second patterned conductors having various thicknesses were deposited on the first patterned conductors by plating with copper using the first patterned conductors as electrodes. After the mask resist layers were removed, the second patterned conductors were subjected to wet etching with a 10% ferric chloride solution to form curved parts.

Dielectric substrates were prepared which were made of epoxy resin and had a thickness of 15 μm. The glass substrates having the first and second patterned conductors were disposed on one side of the dielectric substrates while insulating substrates on which ground conductors made of sputtered copper films were deposited were disposed on the other side of the dielectric substrates. The glass substrates and the insulating substrates were pressed with the dielectric substrates disposed therebetween while the dielectric substrates were heated to 180° C., thereby embedding the first and second patterned conductors into the dielectric substrates. After the glass substrates were peeled off, the conductive seed layers, the conductive seed layers were removed by wet etching with a 10% ferric chloride solution.

Thus high-frequency wiring structures in Examples 1 to 5 and Comparative Examples 1 to 3 were produced. In the high-frequency wiring structures, transmission conductors composed of the first and second patterned conductors were embedded in one side of the dielectrics while the ground conductors were bonded to the other side of the dielectrics. The radius of curvature R of the curved parts was controlled within the range of 0% to 60% of the thickness of the transmission conductors by adjusting the thickness of the second patterned conductors.

Figure 6:
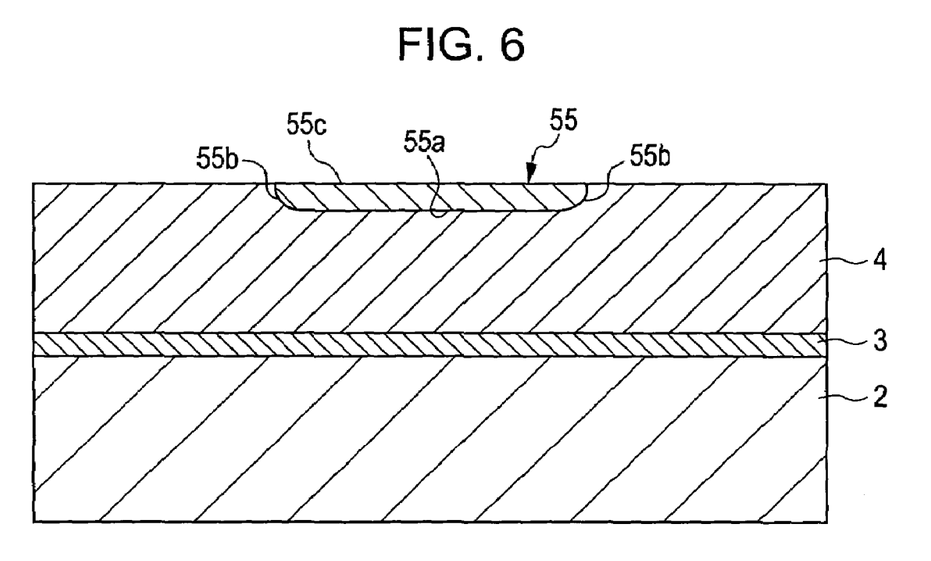
FIG. 6 is a schematic sectional view of a high-frequency wiring structure in Comparative Example 4 (a conventional structure).

Referring to FIG. 6, additionally, a high-frequency wiring structure in Comparative Example 4 was produced. This high-frequency wiring structure included a transmission conductor 55 defined by a flat bottom 55a, a pair of continuously curved parts 55b positioned on both sides of the flat bottom 55a in the width direction, and a flat top 55c that joins the pair of curved parts 55b and is parallel to the flat bottom 55a. The transmission conductor 55 in Comparative Example 4 had a conventional shape with no flat sides. The radius of curvature of the curved parts 55b of the transmission conductor 55 in Comparative Example 4 was equivalent to a radius of curvature R (%) of 30%.

The microstrip line (MSL) loss of the high-frequency wiring structures in Examples 1 to 5 and Comparative Examples 1 to 4 was measured at an operating frequency of 5 GHz. Table 1 shows the results.

TABLE 1

| | Radius of curvature R (%) | MSL loss (dB) |
|---|---|---|
| Example 1 | 5 | −0.58 |
| Example 2 | 10 | −0.56 |
| Example 3 | 25 | −0.55 |
| Example 4 | 40 | −0.55 |
| Example 5 | 50 | −0.57 |
| Comparative Example 1 | 0 | −0.59 |
| Comparative Example 2 | 55 | −0.59 |
| Comparative Example 3 | 60 | −0.60 |
| Comparative Example 4 | Equivalent to 30% | −0.57 |

Table 1 shows that the MSL loss was smaller for radii of curvature R (%) within the range of 5% to 50% in a comparison between Examples 1 to 5 and Comparative Examples 1 to 3. In particular, the MSL loss was still smaller for Examples 2 to 4.

A comparison between Examples 3 and 4 and Comparative Example 4 demonstrates that the MSL loss in Comparative Example 4 was larger than those in Examples 3 and 4 in spite of nearly equal radii of curvature R (%). The transmission conductor in Comparative Example 4, having no flat sides, had a smaller cross-sectional area. As a result, the region through which high-frequency current passed was narrower, leading to a larger loss.

What is claimed is:

1. A high-frequency wiring structure comprising a microstrip line comprising a ground conductor, a dielectric disposed on the ground conductor, and a transmission conductor that is at least partially disposed in the dielectric, the transmission conductor being defined by a flat bottom parallel to the ground conductor, a pair of flat sides that are perpendicular to the ground conductor and are positioned on both sides of the flat bottom in the wiring width direction, and curved parts that continuously join the flat bottom and the pair of flat sides, the curved parts having a radius of curvature within the range of 5% to 50% of the thickness of the transmission conductor.

2. The high-frequency wiring structure according to claim 1, wherein the curved parts have a radius of curvature within the range of 10% to 40% of the thickness of the transmission conductor.

3. A method for producing a high-frequency wiring structure comprising a microstrip line comprising a ground conductor, a dielectric disposed on the ground conductor, and a transmission conductor that is at least partially disposed in the dielectric, the method comprising the steps of:

forming a conductive seed layer on a substrate and then forming a mask resist layer in which a conductor pattern portion is opened on the conductive seed layer;

forming a first patterned conductor in the conductor pattern portion by plating and then etching the mask resist layer so that the top surface thereof is flush with the top surface of the first patterned conductor;

forming a second patterned conductor having a thickness within the range of 5% to 50% of the thickness of the first patterned conductor on the first patterned conductor by plating;

removing the mask resist layer and then etching the second patterned conductor to process both sides of the second patterned conductor in the width direction into curved surfaces;

allowing the first and second patterned conductors on the substrate to face the dielectric and then pressing and embedding the first and second patterned conductors into the dielectric; and removing the substrate and the conductive seed layer to form the transmission conductor, which comprises the first and second patterned conductors.

4. A method for producing a high-frequency wiring structure comprising a microstrip line comprising a ground conductor, a dielectric disposed on the ground conductor, and a transmission conductor that is at least partially disposed in the dielectric, the method comprising the steps of:

forming a conductive seed layer on a substrate and then forming a mask resist layer in which a conductor pattern portion is opened on the conductive seed layer;

forming a first patterned conductor having a thickness within the range of 20% to 90% of the thickness of the mask resist layer in the conductor pattern portion by plating;

forming a second patterned conductor having a thickness within the range of 5% to 50% of the thickness of the first patterned conductor on the first patterned conductor and the mask resist layer by sputtering;

removing the mask resist layer and the part of the second patterned conductor that is formed thereon by a lift-off process;

allowing the first and second patterned conductors on the substrate to face the dielectric and then pressing and embedding the first and second patterned conductors into the dielectric; and removing the substrate and the conductive seed layer to form the transmission conductor, which comprises the first and second patterned conductors.

5. The method for producing a high-frequency wiring structure according to claim 3, wherein the second patterned conductor has a thickness within the range of 10% to 40% of the thickness of the first patterned conductor.

6. The method for producing a high-frequency wiring structure according to claim 4, wherein the second patterned conductor has a thickness within the range of 10% to 40% of the thickness of the first patterned conductor.

* * * * *